US012375061B2

United States Patent
Adhikari et al.

(10) Patent No.: US 12,375,061 B2
(45) Date of Patent: *Jul. 29, 2025

(54) TRANSVERSELY-EXCITED FILM BULK ACOUSTIC RESONATOR MATRIX FILTERS

(71) Applicant: Murata Manufacturing Co., Ltd., Nagaokakyo (JP)

(72) Inventors: Pintu Adhikari, West Lafayette, IN (US); Neal Fenzi, Santa Barbara, CA (US); Andrew Guyette, San Mateo, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/478,193

(22) Filed: Sep. 29, 2023

(65) Prior Publication Data

US 2024/0030895 A1 Jan. 25, 2024

Related U.S. Application Data

(63) Continuation of application No. 17/830,219, filed on Jun. 1, 2022, now Pat. No. 11,811,377, which is a
(Continued)

(51) Int. Cl.
*H03H 9/56* (2006.01)
*H03H 3/02* (2006.01)
(Continued)

(52) U.S. Cl.
CPC .............. *H03H 9/564* (2013.01); *H03H 3/02* (2013.01); *H03H 9/02228* (2013.01);
(Continued)

(58) Field of Classification Search
CPC ...... H03H 9/564; H03H 3/02; H03H 9/02228; H03H 9/174; H03H 9/542; H03H 2003/023; H03H 9/568; H04B 1/0057
See application file for complete search history.

(56) References Cited

U.S. PATENT DOCUMENTS 5,705,399 A 1/1998 Larue
5,853,601 A 12/1998 Krishaswamy et al.
(Continued)

FOREIGN PATENT DOCUMENTS

CN 1926763 A 3/2007
CN 201893487 U 7/2011
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Andrea Lindgren Baltzell
*Assistant Examiner* — Kimberly E Glenn
(74) *Attorney, Agent, or Firm* — ArentFox Schiff LLP

(57) ABSTRACT

Radio frequency filters. A radio frequency filter includes a substrate attached to a piezoelectric plate, portions of the piezoelectric plate forming a plurality of diaphragms spanning respective cavities in the substrate. A conductor pattern formed on the piezoelectric plate includes a plurality of interdigital transducers (IDTs) of a respective plurality of resonators, interleaved fingers of each IDT disposed on a respective diaphragm of the plurality of diaphragms. The conductor pattern connects the plurality of resonators in a matrix filter circuit including a first sub-filter and a second sub-filter, each sub-filter comprising two or more resonators from the plurality of resonators.

20 Claims, 8 Drawing Sheets

Related U.S. Application Data continuation of application No. 17/133,849, filed on Dec. 24, 2020, now Pat. No. 11,405,019, which is a continuation-in-part of application No. 17/121,724, filed on Dec. 14, 2020, now Pat. No. 11,405,017.

(60) Provisional application No. 63/087,789, filed on Oct. 5, 2020.

(51) Int. Cl.
  *H03H 9/02* (2006.01)
  *H03H 9/17* (2006.01)
  *H03H 9/54* (2006.01)

(52) U.S. Cl.
  CPC ............ *H03H 9/174* (2013.01); *H03H 9/542* (2013.01); *H03H 2003/023* (2013.01)

(56) References Cited

U.S. PATENT DOCUMENTS

| | | |
|---|---|---|
| 6,540,827 B1 | 4/2003 | Levy et al. |
| 6,707,229 B1 | 3/2004 | Martin |
| 7,135,940 B2 | 11/2006 | Kawakubo et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,802,466 B2 | 9/2010 | Whalen et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,748,923 B2 | 8/2017 | Kando et al. |
| 9,780,759 B2 | 10/2017 | Kimura et al. |
| 10,200,013 B2 | 2/2019 | Bower et al. |
| 10,305,447 B2 | 5/2019 | Raihn et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,513 B2 | 12/2020 | Yantchev |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0041496 A1 | 3/2004 | Imai et al. |
| 2004/0090145 A1 | 5/2004 | Bauer et al. |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0280476 A1 | 12/2005 | Abe et al. |
| 2006/0072875 A1 | 4/2006 | Bhagavatula et al. |
| 2006/0125489 A1 | 6/2006 | Feucht et al. |
| 2006/0131731 A1 | 6/2006 | Sato |
| 2006/0152107 A1 | 7/2006 | Tanaka |
| 2006/0222568 A1 | 10/2006 | Wang et al. |
| 2007/0001549 A1 | 1/2007 | Kando et al. |
| 2007/0090898 A1 | 4/2007 | Kando |
| 2007/0170565 A1 | 7/2007 | Hong et al. |
| 2007/0188047 A1 | 8/2007 | Tanaka |
| 2007/0194863 A1 | 8/2007 | Shibata et al. |
| 2010/0064492 A1 | 3/2010 | Tanaka |
| 2010/0102669 A1 | 4/2010 | Yamanaka |
| 2010/0107388 A1 | 5/2010 | Iwamoto |
| 2010/0123367 A1 | 5/2010 | Tai et al. |
| 2010/0212127 A1 | 8/2010 | Heinze et al. |
| 2010/0223999 A1 | 9/2010 | Onoe |
| 2010/0301703 A1 | 12/2010 | Chen et al. |
| 2011/0109196 A1 | 5/2011 | Goto |
| 2011/0199163 A1 | 8/2011 | Yamanaka |
| 2011/0278993 A1 | 11/2011 | Iwamoto |
| 2013/0015353 A1 | 1/2013 | Tai et al. |
| 2013/0021116 A1 | 1/2013 | Sogoya et al. |
| 2013/0057360 A1 | 3/2013 | Meltaus et al. |
| 2013/0321100 A1 | 12/2013 | Wang |
| 2014/0001919 A1 | 1/2014 | Komatsu |
| 2014/0009032 A1 | 1/2014 | Takahashi et al. |
| 2014/0113571 A1 | 4/2014 | Fujiwara |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0218129 A1 | 8/2014 | Fujiwara |
| 2014/0225684 A1 | 8/2014 | Kando et al. |
| 2014/0312994 A1 | 10/2014 | Meltaus et al. |
| 2015/0070227 A1 | 3/2015 | Kishino et al. |
| 2015/0319537 A1 | 11/2015 | Perois et al. |
| 2015/0333730 A1 | 11/2015 | Meltaus et al. |
| 2016/0028367 A1 | 1/2016 | Shealy |
| 2016/0049920 A1 | 2/2016 | Kishino |
| 2016/0182009 A1 | 6/2016 | Bhattacharjee |
| 2016/0285430 A1 | 9/2016 | Kikuchi et al. |
| 2017/0005638 A1 | 1/2017 | Otagawa et al. |
| 2017/0063332 A1 | 3/2017 | Gilbert et al. |
| 2017/0077902 A1 | 3/2017 | Daimon |
| 2017/0104470 A1 | 4/2017 | Koelle et al. |
| 2017/0170808 A1 | 6/2017 | Iwaki et al. |
| 2017/0179928 A1 | 6/2017 | Raihn et al. |
| 2017/0187352 A1 | 6/2017 | Omura |
| 2017/0214387 A1 | 7/2017 | Burak et al. |
| 2017/0222618 A1 | 8/2017 | Inoue et al. |
| 2017/0222622 A1 | 8/2017 | Solal et al. |
| 2017/0264263 A1 | 9/2017 | Huang et al. |
| 2017/0324394 A1 | 11/2017 | Ebner et al. |
| 2017/0359050 A1 | 12/2017 | Irieda et al. |
| 2017/0370791 A1 | 12/2017 | Nakamura et al. |
| 2018/0062604 A1 | 3/2018 | Koskela et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181833 A1 | 6/2019 | Nosaka |
| 2019/0245518 A1 | 8/2019 | Ito |
| 2019/0273480 A1 | 9/2019 | Lin |
| 2019/0273481 A1 | 9/2019 | Michigami |
| 2019/0386635 A1 | 12/2019 | Plesski et al. |
| 2019/0386637 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski et al. |
| 2020/0091893 A1 | 3/2020 | Plesski et al. |
| 2020/0162052 A1 | 5/2020 | Matsuoka et al. |
| 2020/0220522 A1 | 7/2020 | Nosaka |
| 2020/0228087 A1 | 7/2020 | Michigami et al. |
| 2020/0304091 A1 | 9/2020 | Yantchev |
| 2020/0328728 A1 | 10/2020 | Nakagawa et al. |
| 2020/0336130 A1 | 10/2020 | Turner |
| 2020/0373907 A1 | 11/2020 | Garcia |
| 2021/0006228 A1 | 1/2021 | Garcia |
| 2021/0013859 A1 | 1/2021 | Turner et al. |
| 2021/0013868 A1 | 1/2021 | Plesski |
| 2021/0126619 A1 | 4/2021 | Wang et al. |
| 2021/0273631 A1 | 9/2021 | Jachowski et al. |
| 2021/0384885 A1 | 12/2021 | Daimon et al. |
| 2022/0103160 A1 | 3/2022 | Jachowski |
| 2022/0216842 A1 | 7/2022 | Nagatomo et al. |
| 2022/0231661 A1 | 7/2022 | McHugh |

FOREIGN PATENT DOCUMENTS

| | | |
|---|---|---|
| CN | 112352382 A | 2/2021 |
| DE | 112011100580 T5 | 1/2013 |

(56) References Cited

FOREIGN PATENT DOCUMENTS

| | | | |
|---|---|---|---|
| JP | H0522074 A | 1/1993 | |
| JP | H10209804 A | 8/1998 | |
| JP | 2001244785 A | 9/2001 | |
| JP | 2002300003 A | 10/2002 | |
| JP | 2003078389 A | 3/2003 | |
| JP | 2004096677 A | 3/2004 | |
| JP | 2004129222 A | 4/2004 | |
| JP | 2004304622 A | 10/2004 | |
| JP | 2006173557 A | 6/2006 | |
| JP | 2007251910 A | 9/2007 | |
| JP | 2010103803 A | 5/2010 | |
| JP | 2010109949 A | 5/2010 | |
| JP | 2010233210 A | 10/2010 | |
| JP | 2013528996 A | 7/2013 | |
| JP | 2015054986 A | 3/2015 | |
| JP | 2016001923 A | 1/2016 | |
| JP | 2017220910 A | 12/2017 | |
| JP | 2018166259 A | 10/2018 | |
| JP | 2018207144 A | 12/2018 | |
| JP | 2019186655 A | 10/2019 | |
| JP | 2020088459 A | 6/2020 | |
| JP | 2020113939 A | 7/2020 | |
| JP | 2020155967 A | * | 9/2020 |
| WO | 2010047114 A1 | 4/2010 | |
| WO | 2013021948 A1 | 2/2013 | |
| WO | 2015098694 A1 | 7/2015 | |
| WO | 2015156232 A1 | 10/2015 | |
| WO | 2015182521 A1 | 12/2015 | |
| WO | 2016017104 A1 | 2/2016 | |
| WO | 2016052129 A1 | 4/2016 | |
| WO | 2016147687 A1 | 9/2016 | |
| WO | 2018003273 A1 | 1/2018 | |
| WO | 2018079522 A1 | 5/2018 | |
| WO | 2018163860 A1 | 9/2018 | |
| WO | 2019138810 A1 | 7/2019 | |
| WO | 2019241174 A1 | 12/2019 | |
| WO | 2020092414 A2 | 5/2020 | |
| WO | 2020175234 A1 | 9/2020 | |
| WO | 2021060523 A1 | 4/2021 | |
| WO | 2023002858 A1 | 1/2023 | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate Mems Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary "Meaning of diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001.10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

USPTO/ISA, International Search Report and Written Opinion for PCT Application No. PCT/US2023/017732 dated Jul. 27, 2023.

USPTO/ISA, International Search Report and Written Opinion for PCT Application No. PCT/US2022/082421 dated May 3, 2023.

USPTO/ISA, International Search Report and Written Opinion for PCT Application No. PCT/US2022/081095 dated May 30, 2023.

USPTO/ISA, International Search Report and Written Opinion for PCT Application No. PCT/US2022/079236 dated Mar. 10, 2023.

USPTO/ISA, International Search Report and Written Opinion for PCT Application No. PCT/US2022/081068 dated Apr. 18, 2023.

USPTO/ISA, International Search Report and Written Opinion for PCT Application No. PCT/US2022/080246 dated Mar. 30, 2023.

Gong et al., "Design and Analysis of Lithium-Niobate-Based High Electromechanical Coupling RF-MEMS Resonators for Wideband Filtering", IEEE Transactions on Microwave Theory and Techniques, vol. 61, No. 1, Jan. 2013, pp. 403-413.

* cited by examiner

TRANSVERSELY-EXCITED FILM BULK ACOUSTIC RESONATOR MATRIX FILTERS

CROSS REFERENCE TO RELATED APPLICATION

This patent is a continuation of U.S. patent application Ser. No. 17/830,219, filed Jun. 1, 2022, titled TRANSVERSELY-EXCITED FILM BULK ACOUSTIC RESONATOR MATRIX FILTERS, which is a continuation of U.S. patent application Ser. No. 17/133,849, filed Dec. 24, 2020, titled TRANSVERSELY-EXCITED FILM BULK ACOUSTIC RESONATOR MATRIX FILTERS, now U.S. Pat. No. 11,405,019, which is a continuation-in-part of U.S. patent application Ser. No. 17/121,724, filed Dec. 14, 2020, titled ACOUSTIC MATRIX FILTERS AND RADIOS USING ACOUSTIC MATRIX FILTERS, now U.S. Pat. No. 11,405,017, which claims priority from U.S. Provisional Patent application 63/087,789, filed Oct. 5, 2020, entitled MATRIX XBAR FILTER, all of which are incorporated herein by reference in their entirety.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are N77, which uses the frequency range from 3300 MHz to 4200 MHz, and N79, which uses the frequency range from 4400 MHz to 5000 MHz. Both band N77 and band N79 use time-division duplexing (TDD), such that a communications device operating in band N77 and/or band N79 use the same frequencies for both uplink and downlink transmissions. Bandpass filters for bands N77 and N79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR, which is incorporated herein by reference. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
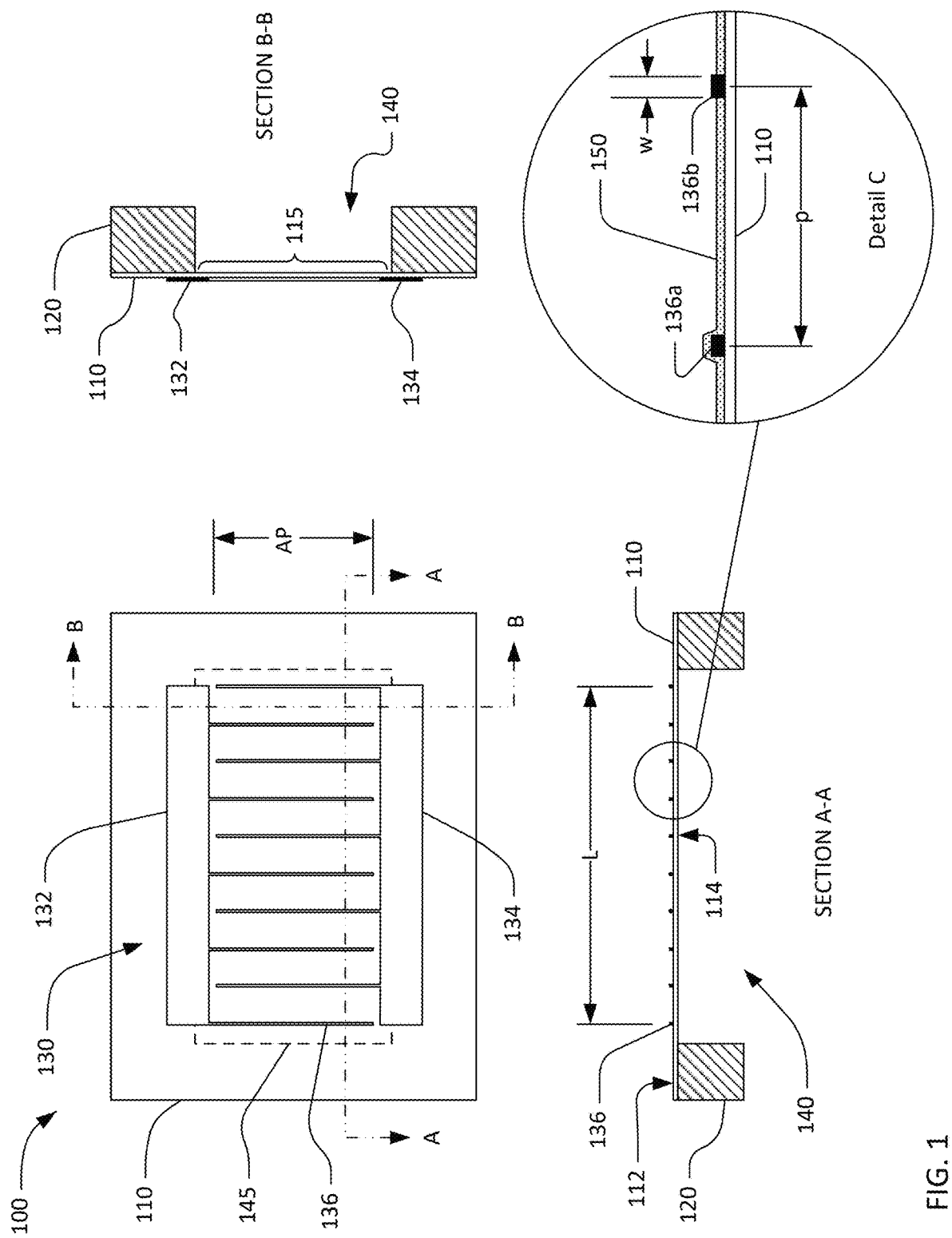
FIG. 1 includes a schematic plan view, two schematic cross-sectional views, and a detailed cross-sectional view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz. The matrix XBAR filters described in this patent are also suited for frequencies above 1 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode of an XBAR is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

The detailed cross-section view (Detail C) shows two IDT fingers 136a, 136b on the surface of the piezoelectric plate 110. The dimension p is the "pitch" of the IDT and the dimension w is the width or "mark" of the IDT fingers. A dielectric layer 150 may be formed between and optionally over (see IDT finger 136a) the IDT fingers. The dielectric layer 150 may be a non-piezoelectric dielectric material, such as silicon dioxide or silicon nitride. The dielectric layer 150 may be formed of multiple layers of two or more materials. The IDT fingers 136a and 136b may be aluminum, copper, beryllium, gold, tungsten, molybdenum, alloys and combinations thereof, or some other conductive material. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars of the IDT 130 may be made of the same or different materials as the fingers.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

An XBAR based on shear acoustic wave resonances can achieve better performance than current state-of-the art surface acoustic wave (SAW), film-bulk-acoustic-resonators (FBAR), and solidly-mounted-resonator bulk-acoustic-wave (SMR BAW) devices. In particular, the piezoelectric coupling for shear wave XBAR resonances can be high (>20%) compared to other acoustic resonators. High piezoelectric coupling enables the design and implementation of microwave and millimeter-wave filters of various types with appreciable bandwidth.

Figure 2B:
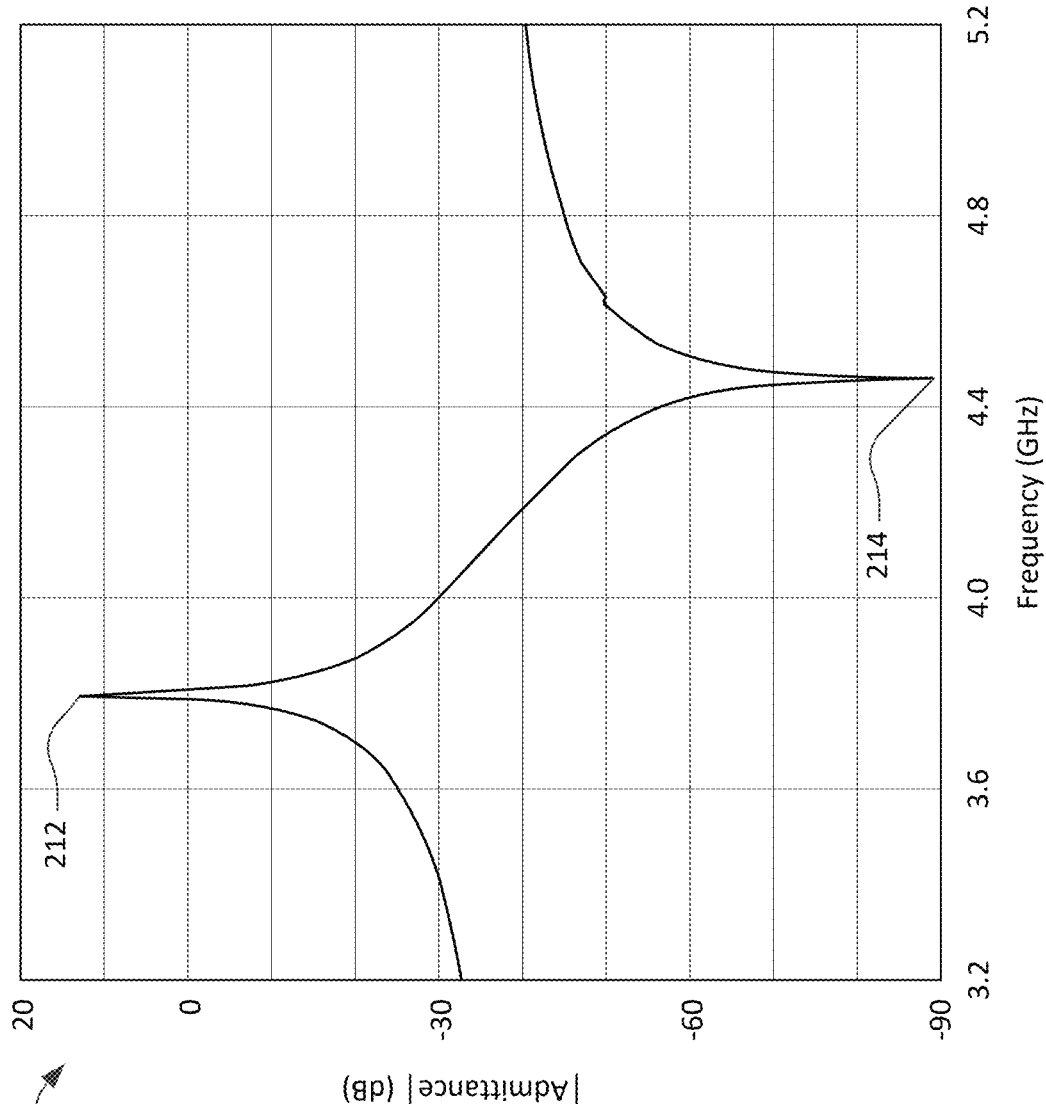
FIG. 2B is a graph of the admittance of an ideal acoustic resonator.
Figure 2A:
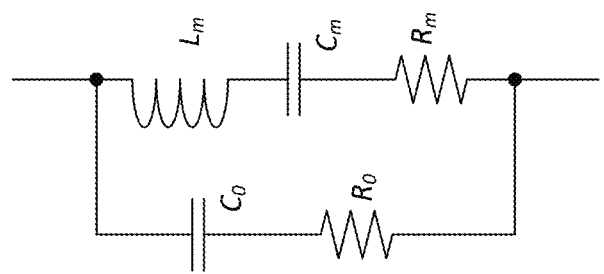
FIG. 2A is an equivalent circuit model of an acoustic resonator.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma=C_0/C_m$ is dependent on the resonator structure and the type and the orientation of the crystalline axes of the piezoelectric material.

FIG. 2B is a graph 200 of the magnitude of admittance of a theoretical lossless acoustic resonator. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$. In a lossless resonator ($R_m=R_0=0$), the frequency $F_r$ of the resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

In over-simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

Figure 2C:
FIG. 2C is a circuit symbol for an acoustic resonator.

FIG. 2C shows the circuit symbol for an acoustic resonator such as an XBAR. This symbol will be used to designate each acoustic resonator in schematic diagrams of filters in subsequent figures.

Figure 3A:
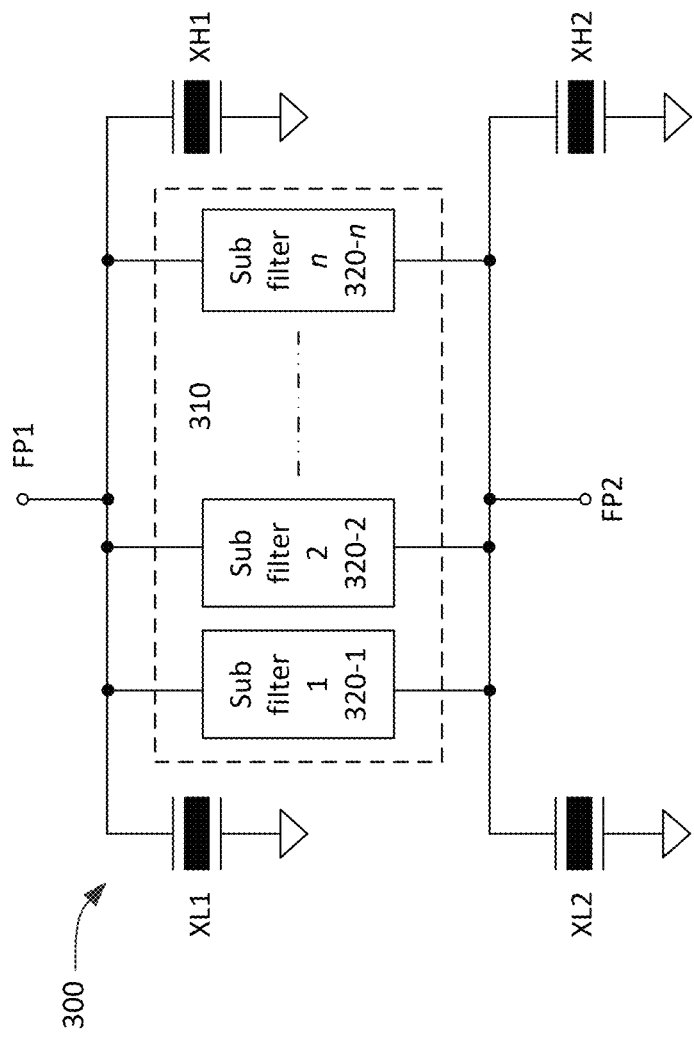
FIG. 3A is a schematic diagram of a matrix filter using acoustic resonators.

FIG. 3A is a schematic diagram of a matrix filter 300 using acoustic resonators. The matrix filter 300 includes an array 310 of n sub-filters 320-1, 320-2, 320-*n* connected in parallel between a first filter port (FP1) and a second filter port (FP2), where n is an integer greater than one. Each of the n sub-filters 320-1, 320-2, 320-*n* is a bandpass filter having a bandwidth about 1/n times the bandwidth of the matrix filter 300. The sub-filters 320-1, 320-2, 320-*n* have contiguous passbands such that the bandwidth of the matrix filter 300 is equal to the sum of the bandwidths of the constituent sub-filters. In the subsequent examples in this patent n=3. n can be less than or greater than 3 as necessary to provide the desired bandwidth for the matrix filter 300.

The array 310 of sub-filters is terminated at both ends by acoustic resonators XL1, XL2, XH1, and XH2, which are preferably but not necessarily XBARs. The acoustic resonators XL1, XL2, XH1, and XH2 create "transmission zeros" at their respective resonance frequencies. A "transmission zero" is a frequency where the input-output transfer function of the filter is very low (and would be zero if the acoustic resonators XL1, XL2, XH1, and XH2 were lossless). Typically, but not necessarily, the resonance frequencies of XL1 and XL2 are equal, and the resonance frequencies of XH1 and XH2 are equal. The resonant frequencies of the acoustic resonators XL1, XL2 are selected to provide transmission zeros adjacent to the lower edge of the filter passband. XL1 and XL2 may be referred to as "low-edge resonators" since their resonant frequencies are proximate the lower edge of the filter passband. The acoustic resonators XL1 and XL2 also act as shunt inductances to help match the impedance at the ports of the filter to a desired impedance value. In the subsequent examples in this patent, the impedance at all ports of the filters is matched to 50 ohms. The resonant frequencies of acoustic resonators XH1, XH2 are selected to provide transmission zeros at or above the higher edge of the filter passband. XH1 and XH2 may be referred to as "high-edge resonators" since their resonant frequencies are proximate the higher edge of the filter passband. High-edge resonators XH1 and XH2 may not be required in all matrix filters.

Figure 3B:
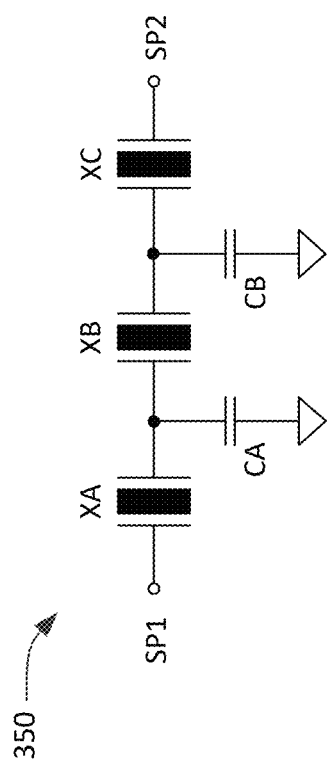
FIG. 3B is a schematic diagram of a sub-filter of FIG. 3A.

FIG. 3B is a schematic diagram of a sub-filter 350 suitable for sub-filters 320-1, 320-2, and 320-*n*. The sub-filter 350 includes three acoustic resonators XA, XB, XC connected in series between a first sub-filter port (SP1) and a second sub-filter port (SP2). The acoustic resonators X1, X2, X3 are preferably but not necessarily XBARs. The sub-filter 350 includes two coupling capacitors CA, CB, each of which is connected between ground and a respective node between two of the acoustic resonators. The inclusion of three acoustic resonators in the sub-filter 350 is exemplary. A sub-filter may have m acoustic resonators, where m is an integer greater than one. A sub-filter with m acoustic resonators includes m−1 coupling capacitors. The m acoustic resonators of a sub-filter are connected in series between the two ports SP1 and SP2 of a sub-filter and each of the m−1 coupling capacitors is connected between ground and a node between a respective pair of acoustic resonators from the m acoustic resonators.

Compared to other types of acoustic resonators, XBARs have very high electromechanical coupling (which results in a large difference between the resonance and anti-resonance frequencies), but low capacitance per unit area. The matrix filter architecture, as shown in FIG. 3A and FIG. 3B, takes advantage of the high electromechanical coupling of XBARs without requiring high resonator capacitance.

Figure 4:
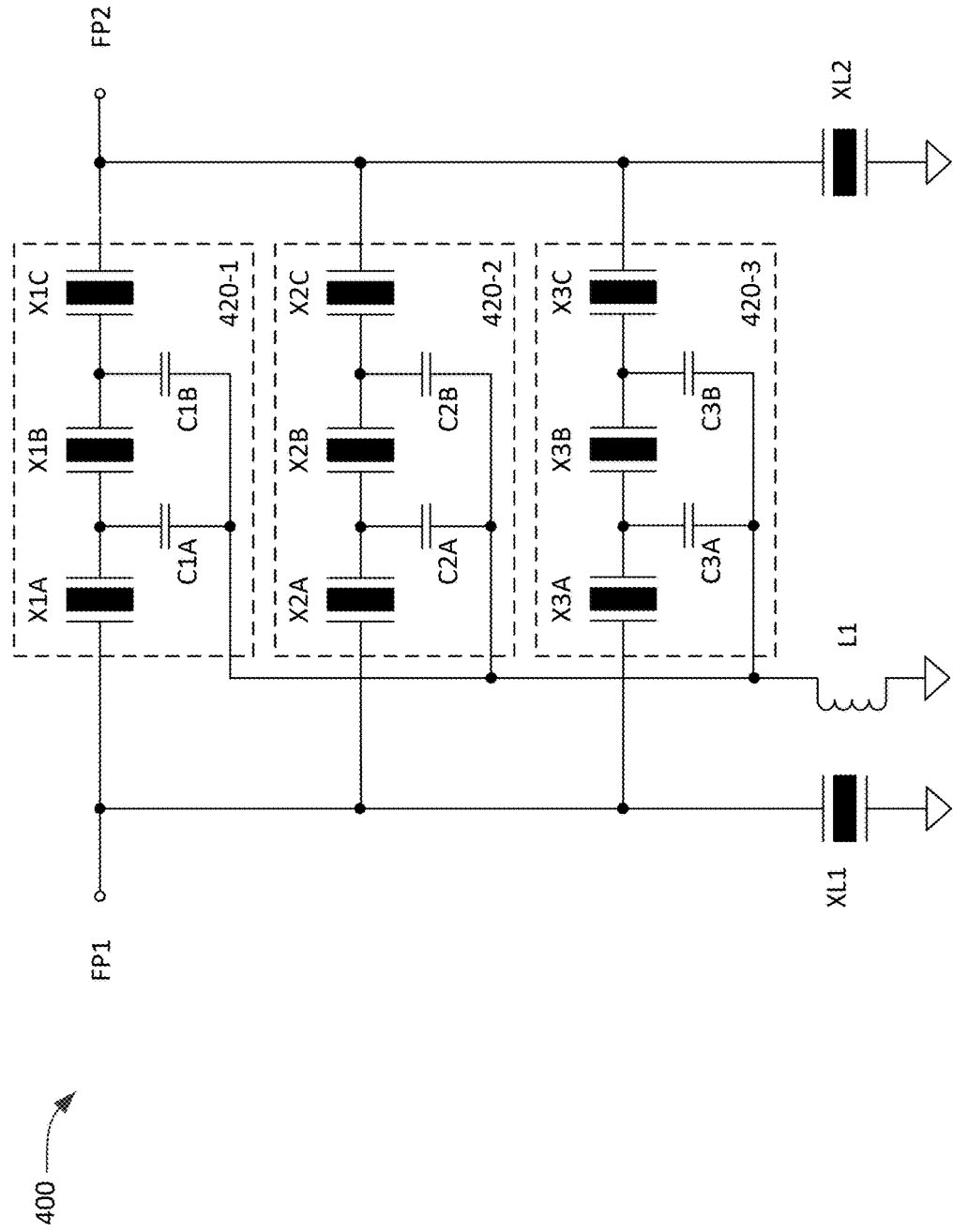
FIG. 4 is a schematic diagram of a matrix filter using transversely-excited film bulk acoustic resonators.

FIG. 4 is a schematic circuit diagram of an exemplary matrix filter 400 implemented with XBARs. The matrix filter 400 includes three sub-filters 420-1, 420-2, 420-3 connected in parallel between a first filter port (FP1) and a second filter port (FP2). The sub-filters 420-1, 420-2, 420-3 have contiguous passbands such that the bandwidth of the matrix filter 300 is equal to the sum of the bandwidths of the constituent sub-filters. Each sub-filter includes three XBARs connected in series and two capacitors. For example, sub-filter 420-1 includes XBARs X1A, X1B, X1C and capacitors C1A, C1B. Components of the other sub-filters 420-2 and 420-3 are similarly identified. Low-edge XBARs XL1 and XL2 are connected between FP1 and FP2, respectively, and ground. All of the capacitors within the sub-filters are connected to ground through a common inductor L1. The inclusion of the inductor L1 improves the out-of-band rejection of the matrix filter 400. The matrix filter 400 does not include high-edge resonators.

The exemplary matrix filter 400 is symmetrical in that the impedances at FP1 and FP2 are both equal to 50 ohms. The internal circuitry of the filter is also symmetrical, with XBARs X_A and X_C within each sub-filter being the same and low-edge resonators XL1 and XL2 being the same. Other matrix filters may be designed to have significantly different impedances at FP1 and FP2, in which event the internal circuitry will not be symmetrical.

Figure 5:
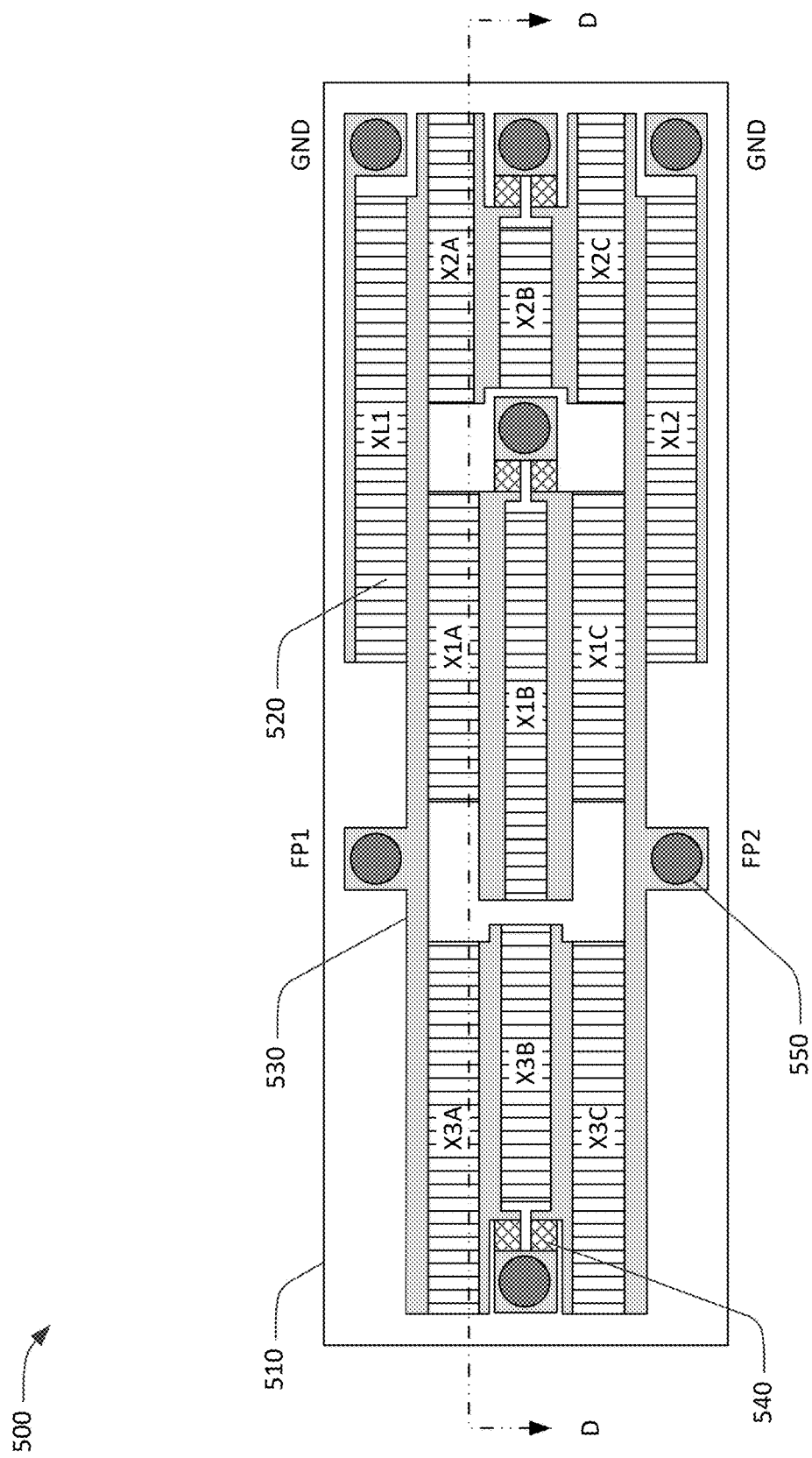
FIG. 5 is plan view of an embodiment of the matrix filter of FIG. 4.

FIG. 5 is a plan view of an exemplary matrix filter 500 which has the same schematic circuit diagram as the matrix filter 400 of FIG. 4. The exemplary matrix filter is an LTE band 41 bandpass filter with a passband from 2496 to 2690 MHz.

The matrix filter 500 includes a Z-cut lithium tantalate piezoelectric plate 510 which is bonded to a substrate (not visible). The thickness of the piezoelectric plate is 730 nm. Other matrix filters may use lithium niobate piezoelectric plates and other crystal orientations including rotated Z-cut and rotated Y-cut.

The matrix filter 500 includes eleven XBARs, such as the XBAR 520. A cavity (not visible) is formed in the substrate under each XBAR. Each XBAR is shown as a rectangle with vertical hatching and is identified by the designator (XL1, X1A, . . . ) used in the schematic diagram of FIG. 4. The vertical hatching is representative of the direction of the IDT fingers of each XBAR but not to scale. Each XBAR has between 65 and 130 IDT fingers. The IDT fingers are aluminum 925 nm thick. The apertures (vertical direction as shown in FIG. 5) of the XBARs range from 40 microns to 58 microns, and the lengths (left-right direction as shown in FIG. 5) range from 500 to 1000 microns. In other embodiments of XBAR matrix filters, the XBARs may be divided into sections to limit the length of the diaphragm within each XBAR. The pitch of the IDTs of each XBAR is between 7.5 and 8.6 microns and the mark/pitch ratio of each XBAR is between 0.22 and 0.31.

The XBARs are connected by conductors such as conductor 530. Cross-hatched rectangles are metal-insulator-metal capacitors, of which only capacitor 540 is identified. The identified capacitor 540 is C3B in the schematic diagram of FIG. 4.

Connections from the filter 510 and circuitry external to the filter are made by means of conductive pads indicated by shaded circles, such as conductive pad 550. The conductive pads for Filter Port 1 (FP1), Filter Port 2 (FP2), and ground (GND) are labeled. The three other conductive pads connect to ground through inductor L1 (in FIG. 4), which is located external to the filter 510.

As previously described, the sub-filters of a matrix filter have contiguous passbands that span the passband of the matrix filter. Within a matrix filter, the center frequency of the passband of each sub-filter is different from the center frequency of any other sub-filter. Consequentially, the resonance frequencies of the XBARs in the sub-filter are different from the resonance frequencies of the XBARs within any other sub-filter.

The resonance frequency of an XBAR is primarily determined by the thickness of the diaphragm within the XBAR. The resonance frequency has a smaller dependence on IDT pitch and mark or finger width. U.S. Pat. No. 10,491,291 describes the use of a dielectric layer formed between the IDT fingers to adjust the resonance frequency of an XBAR.

Figure 6:
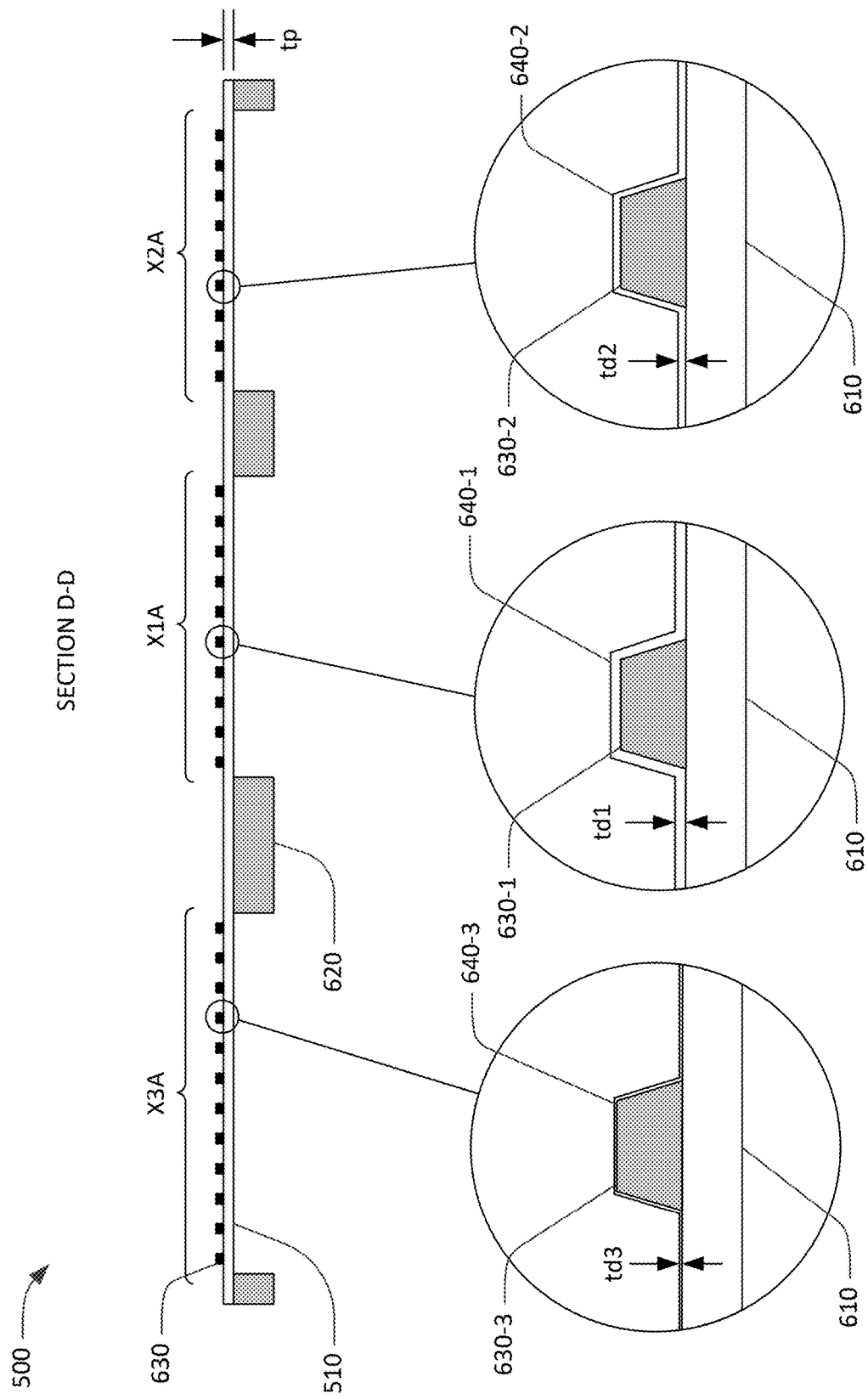
FIG. 6 is a schematic cross-sectional view of the matrix filter of FIG. 5.

FIG. 6 is a schematic cross-section view of the matrix filter 500 at a section plane D-D defined in FIG. 5. The section plane D-D passes through one XBAR (X1A, X2A, X3A) from each of the three sub-filters in the matrix filter 500. Each XBAR includes IDT fingers (of which only IDT finger 630 is identified) formed on a respective diaphragm spanning a respective cavity in a substrate 620. Each diaphragm includes a portion of a piezoelectric plate 510. As in previous figures, the thickness of the piezoelectric plate 510 and the thickness, pitch, and finger width of the IDTs are greatly exaggerated for visibility. Drawn to scale, the thickness of the piezoelectric plate 610 and the IDT fingers would be less than one-half percent of the thickness of the substrate 620 and each IDT would have 65 to 130 IDT fingers.

The three detail views illustrate the use of dielectric thickness to set the resonance frequencies of the XBARs within each sub-filter. Consider first the detail view of an IDT finger of XBAR X1A (the middle view of the three detail views), which shows an IDT finger 630-1 formed on a portion of the piezoelectric plate 510. The IDT finger 630-1 is shown with a trapezoidal cross-section. The trapezoidal shape is exemplary and IDT fingers may have other cross-sectional shapes. The IDT finger 630-1 and the space between IDT finger 630-1 and adjacent IDT fingers is covered by a dielectric layer 640-1 having a thickness td1.

Similarly, the right-hand detail shows IDT finger 630-2 from XBAR X2A, which is covered by a dielectric layer 640-2 having a thickness td2. The left-hand detail shows IDT finger 630-3 from XBAR X3A, which is covered by a dielectric layer 640-3 having a thickness td3. The dielectric layers 640-1, 640-2, 640-3 may be silicon dioxide, silicon nitride, aluminum oxide or some other dielectric material or combination of materials. The dielectric layers 640-1, 640-2, 640-3 may be the same or different materials.

In this example, XBAR X1A is an element of the sub-filter with the lowest passband frequency and XBAR X3A is an element of the sub-filter with the highest passband frequency. In this case $td1 > td2 > td3 \geq 0$.

In a more general case where a matrix filter has n sub-filters, which are numbered in order of increasing passband frequency, td1>td2> ... >tdn, where tdi is the dielectric thickness over the XBARs of sub-filter i.

An XBAR filter device typically includes a passivation dielectric layer applied over the entire surface of the device, other than contact pads, to seal and passivate the conductor patterns and other elements of the device. The thickness $t_{pass}$ of the passivation layer sets the minimum dielectric thickness over the IDTs of the XBARs. Further, a practical maximum dielectric thickness over the IDTs of the XBARs is about 0.35 times the thickness tp of the piezoelectric plate. Above this dielectric thickness, substantial energy may be coupled into spurious acoustic modes that degrade the performance of a matrix filter. With these constraints, 0.35tp≥td1>td2> ... >tdn≥tpass.

Figure 7:
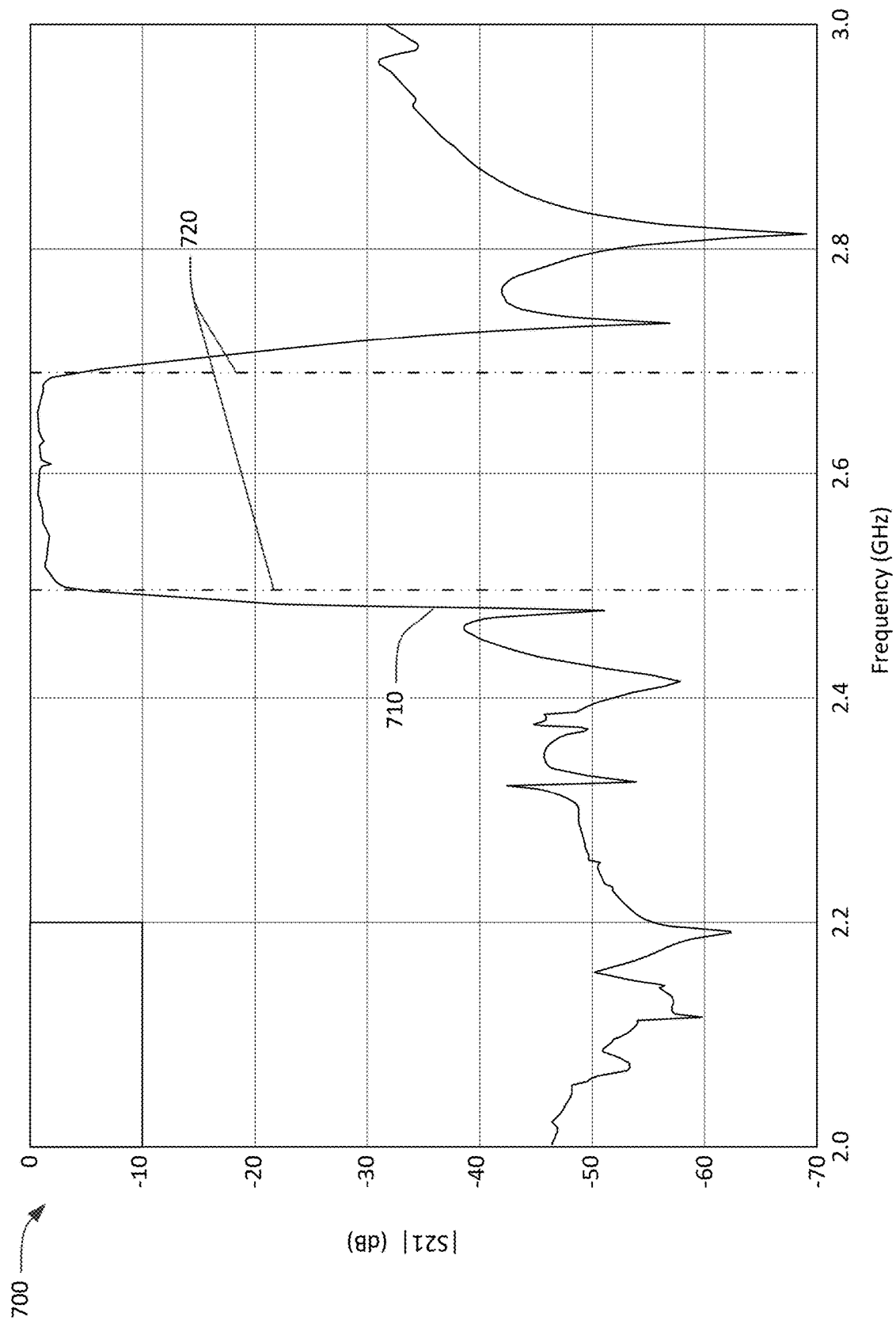
FIG. 7 is a graph of input-output transfer functions of an embodiment of the multiplexer of FIGS. 4-6.

FIG. 7 is graph 700 of the simulated performance of a matrix filter similar to the matrix filter 500. The curve 710 is a plot of S21, the input-output transfer function, of the filter determined by simulation of a physical model of the filter using finite element techniques. The broken lines 720 mark the band edges of 5G NR communication band n41. The matrix filter architecture extends the application of XBARs to lower frequency communications bands that are impractical using a conventional ladder filter architecture.

Description of Methods

Figure 8:
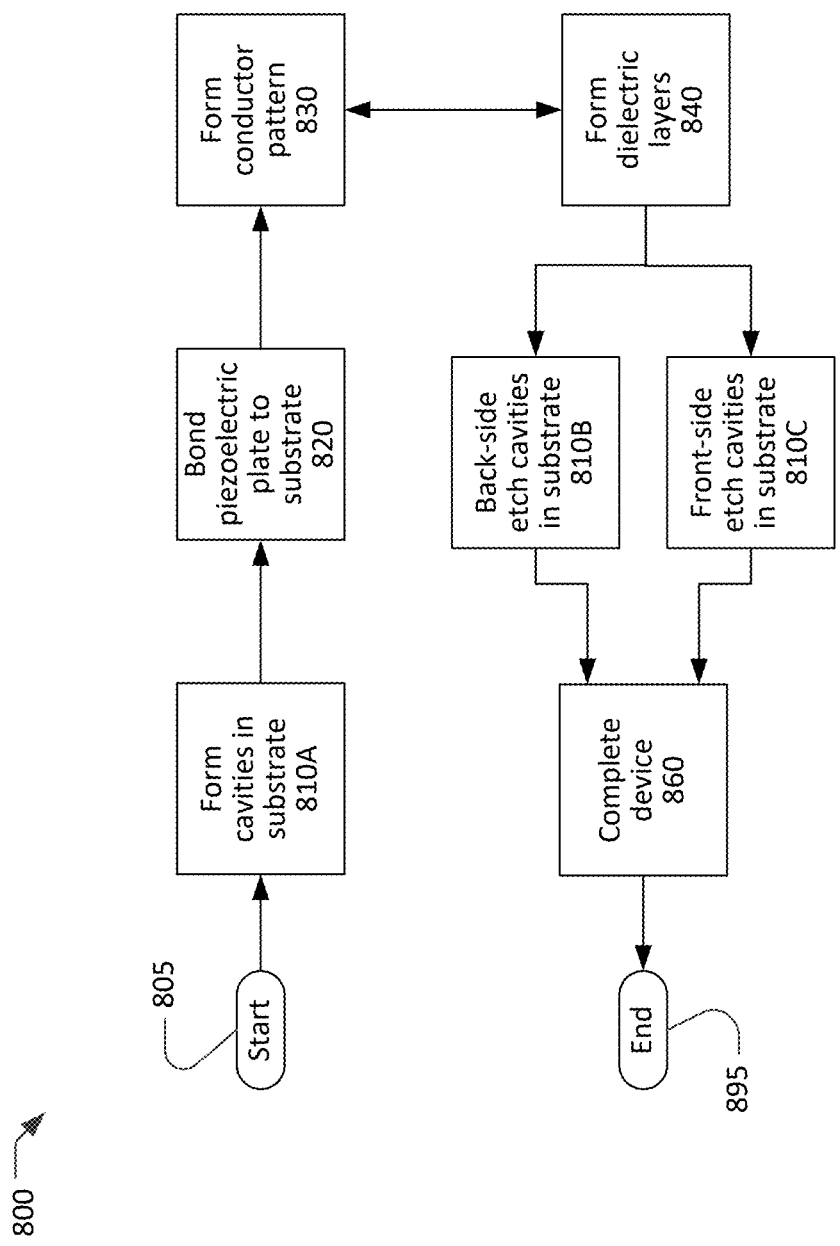
FIG. 8 is flow chart of a process for making a matrix filter using transversely-excited film bulk acoustic resonators.

FIG. 8 is a simplified flow chart showing a process 800 for making an XBAR or a filter incorporating XBARs. The process 800 starts at 805 with a substrate and a plate of piezoelectric material and ends at 895 with a completed XBAR or filter. The flow chart of FIG. 8 includes only major process steps. Various conventional process steps (e.g. surface preparation, cleaning, inspection, baking, annealing, monitoring, testing, etc.) may be performed before, between, after, and during the steps shown in FIG. 8.

The flow chart of FIG. 8 captures three variations of the process 800 for making an XBAR which differ in when and how cavities are formed in the substrate. The cavities may be formed at steps 810A, 810B, or 810C. Only one of these steps is performed in each of the three variations of the process 800.

The piezoelectric plate may be, for example, Z-cut lithium niobate or lithium tantalate with Euler angles 0, 0, 90°. The piezoelectric plate may be rotated Z-cut lithium niobate with Euler angles 0, β, 90°, where β is in the range from −15° to +5°. The piezoelectric plate may be rotated Y-cut lithium niobate or lithium tantalate with Euler angles 0, β, 0, where β is in the range from 0 to 60°. The piezoelectric plate may be some other material or crystallographic orientation. The substrate may preferably be silicon. The substrate may be some other material that allows formation of deep cavities by etching or other processing.

In one variation of the process 800, one or more cavities are formed in the substrate at 810A, before the piezoelectric plate is bonded to the substrate at 820. A separate cavity may be formed for each resonator in a filter device. The one or more cavities may be formed using conventional photolithographic and etching techniques. Typically, the cavities formed at 810A will not penetrate through the substrate.

At 820, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 830 by depositing and patterning two or more conductor levels on the front side of the piezoelectric plate. The conductor levels typically include a first conductor level that includes the IDT fingers, and a second conductor level formed over the IDT busbars and other conductors except the IDT fingers. In some devices, a third conductor levels may be formed on the contact pads. Each conductor level may be one or more layers of, for example, aluminum, an aluminum alloy, copper, a copper alloy, or some other conductive metal. Optionally, one or more layers of other materials may be disposed below (i.e. between each conductor layer and the piezoelectric plate) and/or on top of each conductor layer. For example, a thin film of titanium, chrome, or other metal may be used to improve the adhesion between the first conductor level and the piezoelectric plate. The second conductor level may be conduction enhancement layer of gold, aluminum, copper or other higher conductivity metal may be formed over portions of the first conductor level (for example the IDT bus bars and interconnections between the IDTs).

Each conductor level may be formed at 830 by depositing the appropriate conductor layers in sequence over the surface of the piezoelectric plate. The excess metal may then be removed by etching through patterned photoresist. The conductor level can be etched, for example, by plasma etching, reactive ion etching, wet chemical etching, and other etching techniques.

Alternatively, each conductor level may be formed at 830 using a lift-off process. Photoresist may be deposited over the piezoelectric plate. and patterned to define the conductor level. The appropriate conductor layers may be deposited in sequence over the surface of the piezoelectric plate. The photoresist may then be removed, which removes the excess material, leaving the conductor level.

When a conductor level has multiple layers, the layers may be deposited and patterned separately. In particular, different patterning processes (i.e. etching or lift-off) may be used on different layers and/or levels and different masks are required where two or more layers of the same conductor level have different widths or shapes.

At 840, dielectric layers may be formed by depositing one or more layers of dielectric material on the front side of the piezoelectric plate. As previously described, the dielectric layers may include a different dielectric thickness over the IDT fingers of the XBARs within each sub-filter. Each dielectric layer may be deposited using a conventional deposition technique such as sputtering, evaporation, or chemical vapor deposition. Each dielectric layer may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

The matrix filter shown in FIG. 5 and FIG. 6 includes metal-insulator-metal (MIM) capacitors. A MIM capacitor consists of a first metal level and a second metal level separated by a dielectric layer. When a matrix filter includes MIM capacitor, the steps of forming the conductor patterns at 830 and forming the dielectric layers at 840 must overlap. At least one dielectric layer has to be formed at 840 after a first metal level is formed at 830 and before a final metal level is formed at 830.

In a second variation of the process 800, one or more cavities are formed in the back side of the substrate at 810B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In the second variation of the process 800, a back-side dielectric layer may be formed at 850. In the case where the cavities are formed at 810B as holes through the substrate, the back-side dielectric layer may be deposited through the cavities using a conventional deposition technique such as sputtering, evaporation, or chemical vapor deposition.

In a third variation of the process 800, one or more cavities in the form of recesses in the substrate may be formed at 810C by etching the substrate using an etchant introduced through openings in the piezoelectric plate. A separate cavity may be formed for each resonator in a filter device.

In all variations of the process 800, the filter device is completed at 860. Actions that may occur at 860 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 860 is to tune the resonant frequencies of the resonators within the device by adding or removing metal or dielectric material from the front side of the device. After the filter device is completed, the process ends at 895.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A radio frequency filter, comprising:
    a substrate;
    at least one piezoelectric layer above the substrate, portions of the at least one piezoelectric layer over respective cavities of the radio frequency filter;
    a conductor pattern at the at least one piezoelectric layer, the conductor pattern including a plurality of interdigital transducers (IDTs) of a respective plurality of resonators, interleaved fingers of each IDT disposed on respective portions of the at least one piezoelectric layer over the respective cavities, wherein the conductor pattern connects the plurality of resonators in a matrix filter circuit comprising a first sub-filter and a second sub-filter, each sub-filter comprising two or more resonators from the plurality of resonators;
    a first dielectric layer having a first thickness and that is over the IDTs of the two or more resonators of the first sub-filter; and
    a second dielectric layer having a second thickness and that is over the IDTs of the two or more resonators of the second sub-filter, the first thickness being different than the second thickness,
    wherein either the first or second dielectric layer has a thickness $t_{dn}$, and
    wherein the radiofrequency filter further comprises a passivation layer of dielectric having a thickness $t_{pass}$ at each of the plurality of resonators, wherein $t_{dn} \geq t_{pass}$.

2. The radio frequency filter of claim 1, further comprising:
    a first port and a second port,
    wherein the two or more resonators of the first sub-filter are connected in series between the first port and the second port, and
    wherein the two or more resonators of the second sub-filter are connected in series between the first port and the second port.

3. The radio frequency filter of claim 2, further comprising:
    a first low-edge resonator, from the plurality of resonators, connected between the first port and ground; and
    a second low-edge resonator, from the plurality of resonators, connected between the second port and ground,
    wherein respective resonance frequencies of the first and second low-edge resonators are adjacent to a lower edge of a passband of the radio frequency filter.

4. The radio frequency filter of claim 3, wherein all of the first and second low-edge resonators have a common substrate material and a common piezoelectric material.

5. The radio frequency filter of claim 2, further comprising:
    a first high-edge resonator, from the plurality of resonators, connected between the first port and ground; and
    a second high-edge resonator, from the plurality of resonators, connected between the second port and ground,
    wherein respective resonance frequencies of the first and second high-edge resonators are adjacent to a higher edge of the passband of the filter.

6. The radio frequency filter of claim 1, wherein the at least one piezoelectric layer and the plurality of IDTs are configured such that respective radio frequency signals applied to the plurality of IDTs excite respective primary shear acoustic modes in the respective portions of the at least one piezoelectric layer over the respective cavities.

7. The radio frequency filter of claim 1, wherein each of the first and second sub-filters comprises:
  m resonators connected in series, where m is an integer greater than one; and
  m−1 capacitors, each capacitor connected from a junction between two of the m resonators and a common terminal.

8. The radio frequency filter of claim 7, wherein each of the m−1 capacitors of each sub-filter are metal-insulator-metal capacitors.

9. The radio frequency filter of claim 7, wherein each of the m−1 capacitors of each sub-filter are interdigitated capacitors.

10. The radio frequency filter of claim 1, wherein the first and second sub-filters are one of a plurality of n sub-filters, each of the n sub-filters further comprising m−1 capacitors that are each connected from a junction between two of the plurality of resonators and a common terminal.

11. The radio frequency filter of claim 10, wherein each of the m−1 capacitors of each of the n sub-filters are metal-insulator-metal capacitors.

12. The radio frequency filter of claim 10, further comprising an inductor connected from the common terminal to ground.

13. A radio frequency filter, comprising:
  a substrate;
  at least one piezoelectric layer above the substrate; and
  a conductor pattern at the at least one piezoelectric layer, the conductor pattern including a plurality of interdigital transducers (IDTs) of a respective plurality of resonators, each IDT including a plurality of interleaved fingers,
  wherein the conductor pattern connects the plurality of resonators in a matrix filter circuit comprising a first sub-filter and a second sub-filter,
  wherein each sub-filter comprises two or more resonators from the plurality of resonators,
  wherein the at least one piezoelectric layer comprises a plurality of portions that are disposed over respective cavities of the radio frequency filter, and
  wherein the interleaved fingers of each of the plurality of IDTs are disposed on respective portions of the plurality of portions of the at least one piezoelectric layer over the respective cavities.

14. A radio frequency filter comprising:
  a substrate;
  a piezoelectric layer above the substrate; and
  a conductor pattern on the at least one piezoelectric layer, the conductor pattern including a plurality of interdigital transducers (IDTs) of a respective plurality of resonators, each IDT including a plurality of interleaved fingers,
  wherein the conductor pattern connects the plurality of resonators in a matrix filter circuit comprising a first sub-filter and a second sub-filter,
  wherein each sub-filter comprises two or more resonators from the plurality of resonators,
  wherein a first dielectric layer having a first thickness is over the IDTs of the two or more resonators of the first sub-filter, and
  wherein a second dielectric layer having a second thickness is over the IDTs of the two or more resonators of the second sub-filter, the first thickness being different than the second thickness.

15. The radio frequency filter of claim 13, further comprising:
  a first port and a second port,
  wherein the two or more resonators of the first sub-filter are connected in series between the first port and the second port, and
  wherein the two or more resonators of the second sub-filter are connected in series between the first port and the second port.

16. The radio frequency filter of claim 15, further comprising:
  a first low-edge resonator, from the plurality of resonators, connected between the first port and ground; and
  a second low-edge resonator, from the plurality of resonators, connected between the second port and ground,
  wherein respective resonance frequencies of the first and second low-edge resonators are adjacent to a lower edge of a passband of the radio frequency filter.

17. The radio frequency filter of claim 16, wherein all of the first and second low-edge resonators have a common substrate material and a common piezoelectric material.

18. The radio frequency filter of claim 13, further comprising:
  a first high-edge resonator, from the plurality of resonators, connected between the first port and ground; and
  a second high-edge resonator, from the plurality of resonators, connected between the second port and ground,
  wherein respective resonance frequencies of the first and second high-edge resonators are adjacent to a higher edge of the passband of the filter.

19. The radio frequency filter of claim 14,
  wherein the at least one piezoelectric layer comprises a plurality of portions that are disposed over respective cavities of the radio frequency filter, and
  wherein the interleaved fingers of each of the plurality of IDTs are disposed on respective portions of the plurality of portions of the at least one piezoelectric layer over the respective cavities.

20. The radio frequency filter of claim 14, wherein:
  either the first dielectric layer or second dielectric layer has a thickness $t_{dn}$, and
  the radiofrequency filter further comprises a passivation layer of dielectric having a thickness $t_{pass}$ at each of the plurality of resonators, wherein $t_{dn} \geq t_{pass}$.

* * * * *